United States Patent [19]

Sato

[11] Patent Number: 5,290,728
[45] Date of Patent: Mar. 1, 1994

[54] METHOD FOR PRODUCING A SEMICONDUCTOR DEVICE

[75] Inventor: Shin-ichi Sato, Nara, Japan

[73] Assignee: Sharp Kabushiki Kaisha, Osaka, Japan

[21] Appl. No.: 964,146

[22] Filed: Oct. 19, 1992

[30] Foreign Application Priority Data

Oct. 21, 1991 [JP] Japan .................................. 3-272880

[51] Int. Cl.⁵ ........................................... H01L 21/70
[52] U.S. Cl. ........................................ 437/52; 437/47; 437/60
[58] Field of Search ................ 437/47, 60, 193, 195, 437/228, 235, 918, , 56, 40, 44

[56] References Cited

U.S. PATENT DOCUMENTS

| | | | |
|---|---|---|---|
| 4,208,780 | 6/1980 | Richman | 437/47 |
| 4,868,138 | 9/1989 | Chan et al. | 437/44 |
| 4,965,226 | 10/1990 | Gootzen et al. | 437/192 |
| 5,006,484 | 4/1991 | Harada | 437/192 |
| 5,187,114 | 2/1993 | Chan et al. | 437/47 |

OTHER PUBLICATIONS

A. Shinohara et al., *Extended Abstracts of the 17th Conference on Solid State Devices and Materials*, Tokyo, 1985, pp. 29-32, "A New Self-Aligned Contact Technology for LDD MOS Transistors."

*Primary Examiner*—Tom Thomas
*Attorney, Agent, or Firm*—Nixon & Vanderhye

[57] ABSTRACT

A method for fabricating a semiconductor device including a contact window formed in an interlevel insulator so as to connect electrodes to an interconnection and to connect impurity diffusion regions to the interconnection is provided. After forming an insulating film whose thickness on a contact region of at least one of the plurality of electrodes, which is to be electrically connected to the interconnection, is smaller than that on at least another one of the plurality of electrodes, which is not to be electrically connected to the interconnection. The interlevel insulator formed on part of the plurality of impurity diffusion regions is etched until a surface of the semiconductor substrate is exposed, and the interlevel insulator on the contact region of at least one of the plurality of electrodes is etched until a surface of the electrode is exposed.

6 Claims, 4 Drawing Sheets 5,290,728

METHOD FOR PRODUCING A SEMICONDUCTOR DEVICE

BACKGROUND OF THE INVENTION

1. Field of the Invention:

The present invention relates to a method for fabricating a semiconductor device, and more particularly to a method for forming a contact window over an impurity diffusion region and an electrode formed on a semiconductor substrate.

2. Description of the Prior Art:

A conventional method for fabricating a semiconductor device is described. A memory cell circuit of a static random access memory (SRAM) of CMOS type, which is one kind of a memory device, is constituted by a plurality of nMOS transistors and pMOS transistors. In a certain transistor among these transistors, it is necessary that an impurity diffusion region thereof is connected to a gate electrode of an adjacent transistor through interconnection. FIG. 4 is a plan view showing part of an example of a memory cell circuit as mentioned above. As shown in FIG. 4, a transistor has a gate electrode 6a and an impurity diffusion region 10. The impurity diffusion region 10 of this transistor is connected to a part of a gate electrode 6b of an adjacent transistor (not shown) through interconnection. Since the interconnection is made on an interlevel insulator, a contact window 15 is formed over the impurity diffusion region 10 and part of the gate electrode 6b. FIGS. 3A to 3C show a method for fabricating the contact window 15 by conventional technique. As shown in FIG. 3A, an isolation region 2 is formed on a silicon substrate 1, and an interlevel insulator 16 including insulating layers 7 and 13 is formed so as to cover the gate electrodes 6a and 6b and the impurity diffusion region 10. The thickness (m) of the interlevel insulator 16 on the impurity diffusion region 10, which should be removed so as to form the contact window 15, is different from that (l) on the gate electrodes 6a and 6b. Thus, when the contact window 15 is formed, it is necessary to etch the interlevel insulator 16 by a thickness of (l) or more. However, when the etched thickness is made (l) or more, the surface of the gate electrode 6b is partially exposed. Therefore, when an interconnection is formed after etching, the gate electrode 6b and the impurity diffusion region 10 are electrically connected to each other. Thus, the formation of the contact window 15 should be made as follows: i.e., in an opening 15a (FIG. 3B), the etched thickness should be (l) or more, and in an opening 15b (FIG. 3C), the etched thickness should be (m) or more and less than (l).

Detailed process will be described as follows. As shown in FIG. 3B, first, a resist pattern 14a having the opening 15a is formed, and the interlevel insulator 16 is etched until the surface of the gate electrode 6b is exposed. Because of this, a first contact window is formed on the gate electrode 6b. Then, as shown in FIG. 3C, a resist pattern 14b having an opening 15b is formed, and the interlevel insulator 16 is etched until the surface of the substrate 1 is exposed. Accordingly, a second contact window is formed on the impurity diffusion region 10.

As described above, according to conventional technique, the contact window 15 is formed in two steps, complicating the process.

Moreover, since an opening is formed in two steps by using different photoresists, it is necessary for the openings 15a and 15b to be designed so as to overlap each other in the region 15c in view of registration error of the lithography technique. In the case where the interlevel insulator 16 is etched using a pattern of the opening 15b after the etching using a pattern of the opening 15a, since the interlevel insulator 16 of the region 15c had already been removed, there is a problem in that the impurity diffusion region 10 of the region 15c will be subjected to significant etching damage.

Moreover, the insulating layers 7 and 13 with a total thickness of (l) are formed on the gate electrodes 6a and 6b. On the inpurity diffusion region 10, the insulating layer 13 alone is formed with a thickness of (m). When the opening 15a is formed and the etching of the interlevel insulator 16 is commenced, the interlevel insulator 16 formed on the impurity diffusion region 10 is removed before the completion of the etching of the interlevel insulator 16 on the gate electrode 6b. Thus, the isolation region 2 is also partially etched until the etching of the interlevel insulator 16 on the gate electrode 6b is completed. Because of this, there is a problem in that the thickness of the isolation region 2 is made partially thin.

SUMMARY OF THE INVENTION

The method for fabricating a semiconductor device of the present invention comprising a plurality of electrodes formed on a semiconductor substrate with an oxide film therebetween, a plurality of impurity diffusion regions formed at the surface of the semiconductor substrate, an interlevel insulator covering the plurality of electrodes and the plurality of impurity diffusion regions, and a contact window formed in the interlevel insulator so as to connect part of the plurality of electrodes to an interconnection and to connect part of the plurality of impurity diffusion regions to the interconnection, comprises the steps of: forming a plurality of electrodes and an insulating film, the thickness of the insulating film on a contact region of at least one of the plurality of electrodes, which is to be electrically connected to the interconnection, being smaller than that on at least another one of the plurality of electrodes, which is not to be electrically connected to the interconnection; forming side walls on sides of the plurality of the electrodes; forming the interlevel insulator; and etching the interlevel insulator formed on part of the plurality of the impurity diffusion regions until a surface of the semiconductor substrate is exposed, and etching the interlevel insulator on the contact region of at least one of the plurality of electrodes, which is electrically connected to the interconnection until a surface of the electrode is exposed.

Thus, the invention described herein makes possible the advantages of (1) providing a method for producing a semiconductor device in which a contact window is readily formed; and (2) providing a method for producing a semiconductor device in which a contact window is formed without causing any damages by etching.

These and other advantages of the present invention will become apparent to those skilled in the art upon reading and understanding the following detailed description with reference to the accompanying figures.

DESCRIPTION OF THE PREFERRED EMBODIMENTS

FIGS. 1A to 1H are schematic cross-sectional views illustrating a method for fabricating a semi-conductor device of the present invention. FIG. 2 is a schematic plan view thereof. Here, as an example, part of a production process for an SRAM of CMOS type will be described.

Figure 1A:
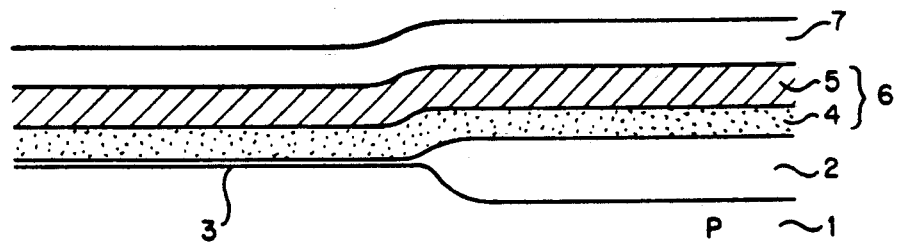
FIGS. 1A to 1H are schematic cross-sectional views illustrating a method for fabricating a semiconductor device of the present invention.
Figure 2:
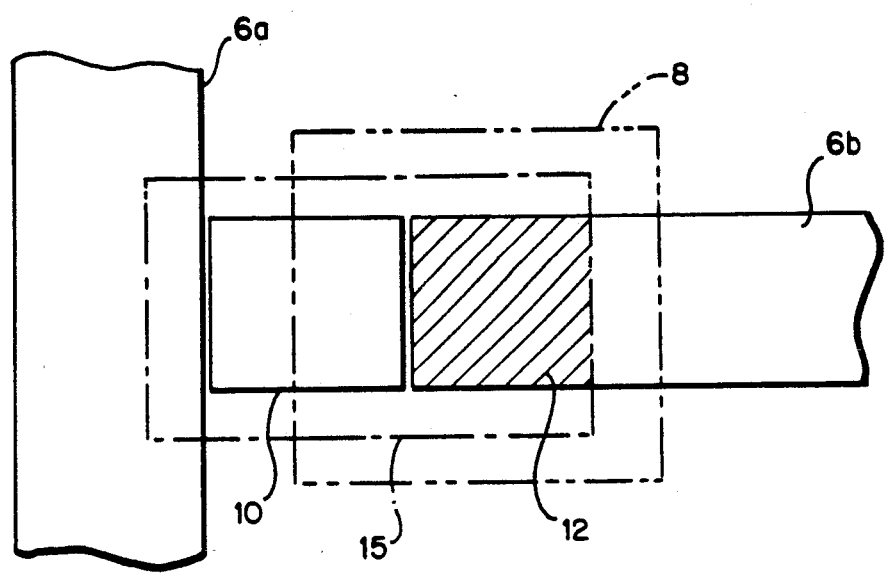
FIG. 2 is a schematic plan view illustrating a method for fabricating the semiconductor device of the present invention.
Figure 4:
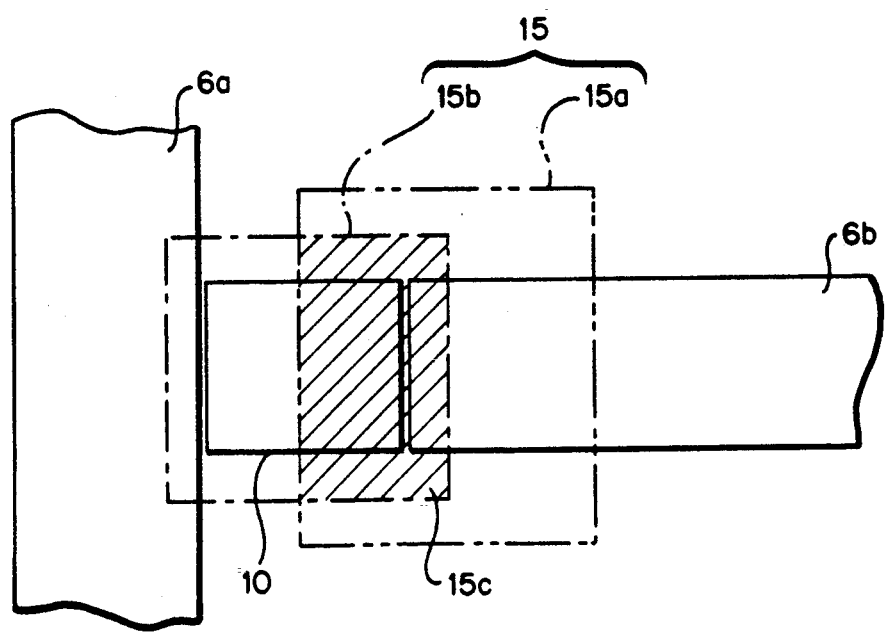
FIG. 4 is a schematic plan view illustrating a method for fabricating the semiconductor device by a conventional technique.
Figure 3A:
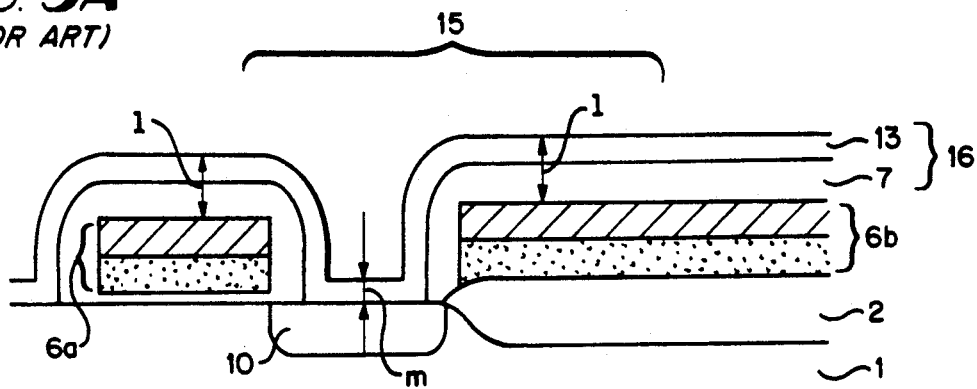
FIGS. 3A to 3C are schematic cross-sectional views illustrating a method for fabricating a semiconductor device by a conventional technique.
Figure 3B:
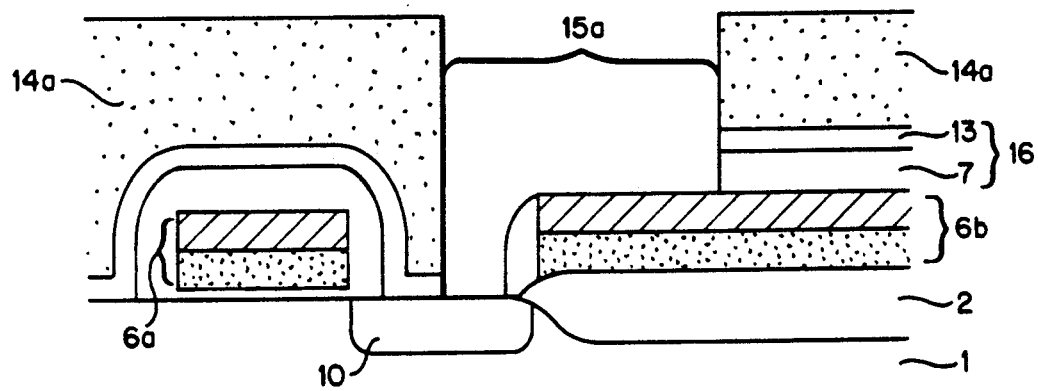
Figure 3C:
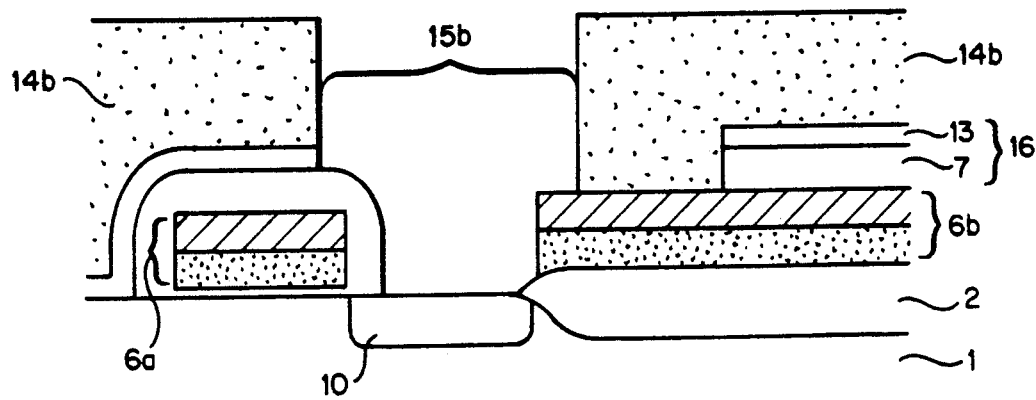

As shown in FIG. 1A, p-type impurity ions are implanted into a silicon substrate 1 to form a p-well. Then, the surface of the silicon substrate 1 is oxidized under wet oxygen atmosphere, whereby an isolation region 2 is formed. Then, the surface of the silicon substrate 1 is oxidized to form an oxide film 3. A polysilicon film 4 (thickness: about 100 nm) is formed on the isolation region 2 and the oxide film 3 by the CVD method using silane, and a tungsten silicide film (thickness: about 100 nm) 5 was formed on the polysilicon film 4 by the CVD method using silane and tungsten (VI) fluoride, whereby a conductive film 6 is formed. Moreover, a silicon oxide film 7 (thickness: about 100 nm) is formed on the conductive film 6 by the CVD method using silane and oxygen.

Figure 1B:
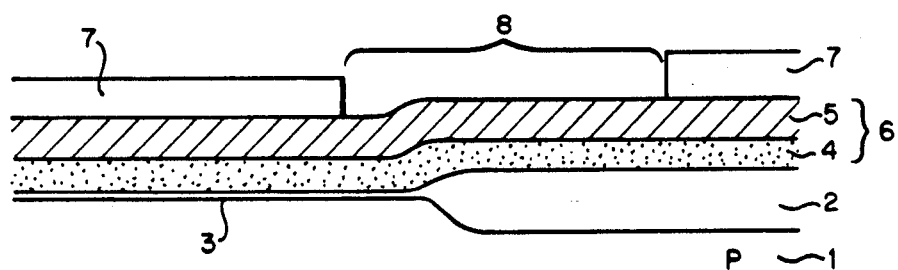

As shown in FIG. 1B, part of the silicon oxide film 7 is removed by lithography and etching technique to form an opening 8. Part of the silicon oxide film 7 is etched by Reactive Ion Etching (RIE), using carbon tetrafluoride and hydrogen. As shown in FIG. 2, the opening 8 is formed on part of an electrode 6b which will be formed in the following step.

Figure 1C:
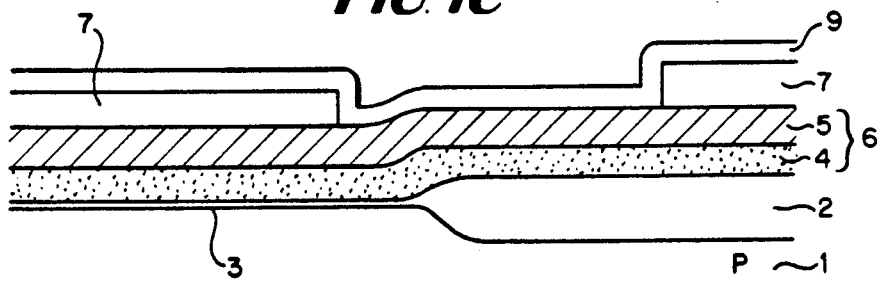
Figure 1D:
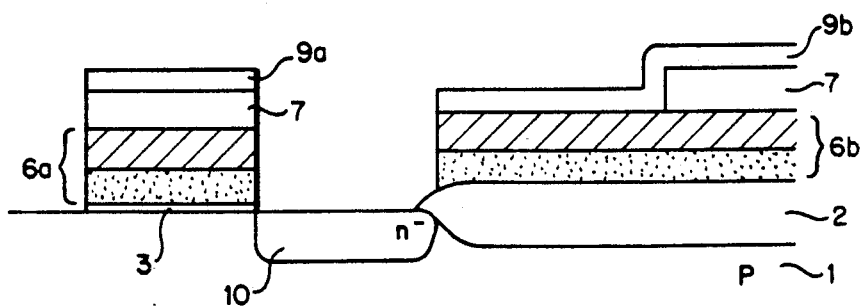

As shown in FIG. 1C, a silicon oxide film 9 (thickness: about 50 nm) is formed on the silicon oxide film 7 and the conductive film 6 in the opening 8. As shown in FIG. 1D, silicon oxide films 9a and 9b are formed by lithography and an etching technique. The conductive film 6 is etched using the silicon oxide films 9a and 9b as masks by the RIE using chlorine. Due to this etching, electrodes 6a and 6b are formed. The electrodes 6a and 6b function as gates of transistors adjacent to each other. The layout of the electrodes 6a and 6b are also shown in FIG. 2.

Figure 1E:
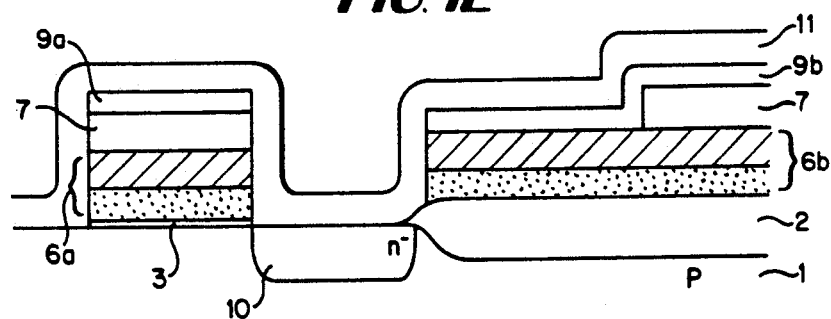
Figure 1F:
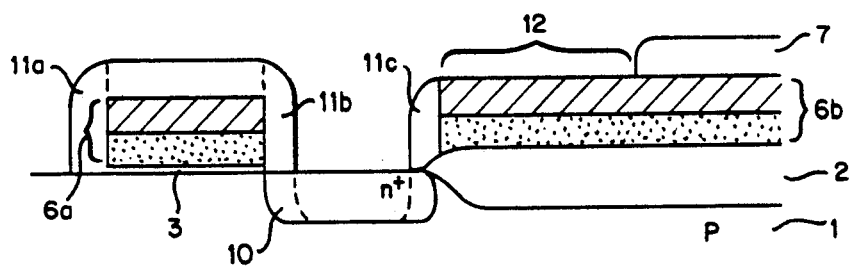
Figure 1G:
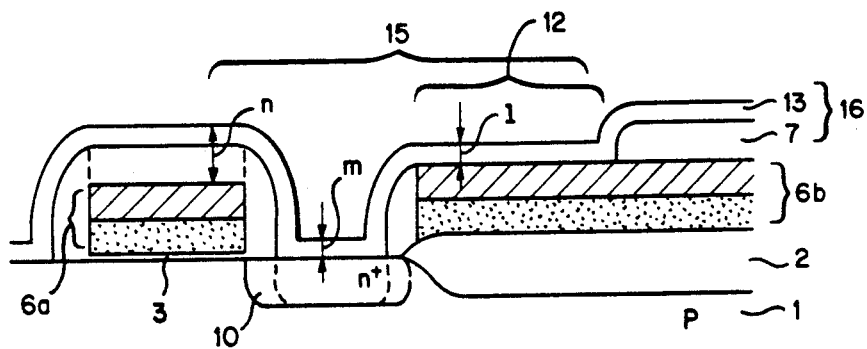
Figure 1H:
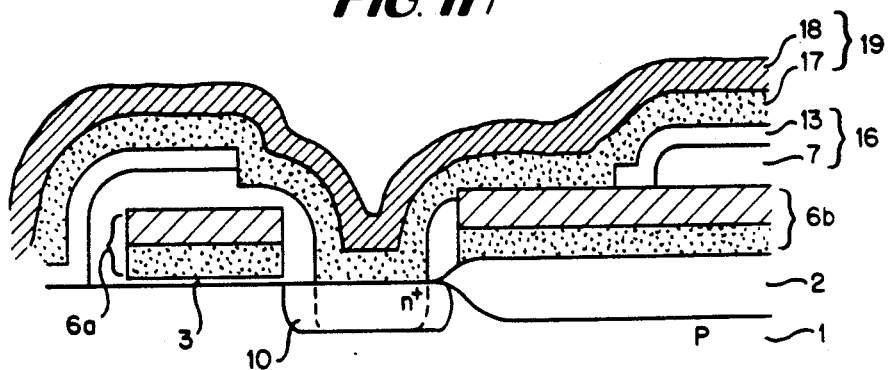

A portion of the electrode 6b, from which the silicon oxide film 7 is removed, will be electrically connected to an interconnection 19, which will be formed later (as shown in FIG. 1H). As shown in FIG. 1D, an insulating layer (i.e., the silicon oxide film 9b) on the portion of the electrode 6b which will be electrically connected to the interconnection 19 has a thickness of about 100 nm less than that of an insulating layer (i.e., the silicon oxide films 7 and 9a) on the electrode 6a which will not be electrically connected to the interconnection 19.

N-type impurities are implanted into the silicon substrate 1 using the electrodes 6a and 6b as masks, whereby an n⁻ region is formed in self-alignment with the masks. As shown in FIG. 1E, a silicon oxide film 11 (thickness: about 80 nm) is formed over an entire surface of the silicon substrate 1. Moreover, as shown in FIG. 1F, a layered silicon oxide film (including the silicon oxide films 7, 9a, 9b, and 11) is etched back from the top surface of the layered silicon oxide film, whereby side walls 11a, 11b, and 11c are formed on the sides of the electrodes 6a and 6b. Then, n-type impurities are implanted into the silicon substrate 1 using the side walls 11a, 11b, and 11c and the electrodes 6a and 6b as masks, whereby an n⁺ region is formed in self-alignment with the masks. The n⁻ and n⁺ regions form an impurity diffusion region 10. In this step, the layered silicon oxide film is almost completely removed from the surface of the impurity diffusion region 10 and that of the contact region 12.

Furthermore, as shown in FIG. 1G, a silicon oxide film 13 (thickness: about 50 nm) is formed over an entire surface of the silicon substrate 1. At this step, the thickness of a layered silicon oxide film 16 (interlevel insulator, including the silicon oxide films 7 and 13, and side walls 11a, 11b, and 11c) is l=m=50 nm, and n=150 nm. Thus, if the silicon oxide film 16 is etched in the range of 50 nm to 150 nm, a contact window 15 is formed over the impurity diffusion region 10 and the contact region 12 of the electrode 6b without exposing the surface of the electrode 6a. As shown in FIG. 1H, the silicon oxide film 16 is patterned by lithography and etching technique. The silicon oxide film 16 is etched by about 60 nm, whereby the contact window 15 is formed over the impurity region region 10 and the contact region 12 of the electrode 6b. This contact window 15 is also shown in FIG. 2. After that, a polysilicon film 17 (thickness: about 100 nm) is formed so as to cover an entire surface of the substrate 1. Moreover, a tungsten silicide film 18 (thickness: about 100 nm) is formed thereon, whereby an interconnection 19 is formed, and the connection between the impurity region region 10 and the interconnection 19, and that between the contact region 12 and the interconnection 19 are completed.

As described in the above example, in FIG. 1G, the thickness of the insulating layer (i.e., the silicon oxide film 13) on the contact region 12 is made thinner than that of the insulating layer (i.e., the layer including the silicon oxide films 7 and 13) on the electrode 6a on which the contact window 15 is not formed; and the silicon oxide film 16 (interlevel insulator) is etched until part of the surface of the electrode 6b is exposed during the formation of the contact window 15, whereby the contact window 15 for connecting the interconnection 19 with the impurity diffusion region 10 is formed in self-alignment with the silicon oxide film 16 on the electrodes 6a and 6b and the side walls 11a, 11b, and 11c. The contact window 15 for connecting the electrode 6b with the interconnection 19 is simultaneously formed. Since the contact window 15 can be formed in one step according to the present invention, the overlapping of openings, which damages the impurity diffusion region 10, is not caused.

In addition, the silicon oxide film 16, which is to be removed for forming the contact window 15, has a uniform thickness in the opening (i.e., on the impurity diffusion region 10), so that the isolation region 2 can be prevented from being etched.

In the above example, the electrode connected to the interconnection and the impurity diffusion region connected to the interconnection are disposed adjacent to each other. However, even in the case where the electrode connected to the interconnection and the impurity diffusion region connected to the interconnection are not disposed adjacent to each other, the contact window can simultaneously be formed over the impurity diffusion region and the electrode in the same process as the above example.

In the above example, the following method is used so that the thickness of the insulating layer on the portion of at least one of the plurality of electrodes, which is connected to the interconnection 19, is made thinner than that of the insulating layer on at least another one of the plurality of electrodes, which is not connected to the interconnection 19. The opening 8 is formed in the silicon oxide film 7, and the silicon oxide film 7, which is on the electrode 6b and is disposed on the contact region 12 electrically connected to the interconnection, is removed. However, it is not necessary to remove all of the silicon oxide film 7, if the thickness of the insulating layer on the contact region 12 of the electrode 6b of the plurality of electrodes, which is connected to the interconnection 19 is made thinner than that of the insulating layer on the electrode 6a of the plurality of electrodes, which is not connected to the interconnection 19. In this case, the etching should be controlled with good precision so that all of the silicon oxide film 16 disposed on the electrode 6a is not removed, when the contact window 15 is formed.

The step, in which the thickness of the insulating layer on the contact region 12 of the electrode 6b of the plurality of electrodes, which is electrically connected to the interconnection 19 is made smaller than that of the insulating layer on the electrode 6a of the plurality of electrodes, which is not electrically connected to the interconnection 19, may be before the formation of the side walls 11a, 11b, and 11c on the electrodes 6a and 6b instead of before the formation of the electrodes 6a and 6b. For example, the silicon oxide film 7 is first patterned, the electrodes 6a and 6b are formed, and then, part of the silicon oxide film 7 on the electrode 6b may be removed.

Moreover, in the above example, a silicon oxide film is used as an insulating layer, insulating layers available in the production of a semiconductor, such as a silicon nitride film and a polyimide film can be used. The conductive layer can be formed from metal such as molybdenum, titanium, and aluminum or silicides thereof. The thickness of the insulating layer and conductive film is not limited to that used in the example.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for fabricating a semiconductor device comprising the steps of:
    forming at least first and second electrodes having an insulating film thereon on a semiconductor substrate, a thickness of the insulating film on a contact region of the first electrode being smaller than that on the second electrode;
    forming an impurity diffusion region in the semiconductor substrate between the first and second electrodes;
    forming insulating side walls on the electrodes;
    forming an insulation layer over the electrodes and the impurity diffusion region to form a multiple level insulator on at least a portion of the electrodes;
    etching the insulation layer covering a portion of the impurity diffusion region until a surface of the impurity diffusion region is exposed;
    at substantially the same time the insulating layer is etched, etching a part of the multiple level insulator on the contact region of the first electrode until a surface of the first electrode is exposed; and
    forming an interconnecting conductive layer over the electrodes and the impurity diffusion region to interconnect the exposed surfaces of the impurity diffusion region with the contact region of the first electrode.

2. A method for fabricating a semiconductor device according to claim 1, further comprising the step of:
    after forming the insulating side walls, forming a higher impurity concentration area within the impurity diffusion region aligned with the insulating side walls.

3. A method for fabricating a semiconductor device according to claim 1, wherein the steps of forming the electrodes and the insulating film further comprises the steps of:
    forming an oxide film on a surface of the semiconductor substrate;
    forming a conductive film on the oxide film;
    forming a first insulating layer on the conductive film;
    removing a portion of the first insulating layer corresponding to the contact region;
    forming a second insulating layer on the first insulating layer and on a surface of the conductive film from which the first insulating layer is removed, thereby forming the insulating film including the first and second insulating layers; and
    patterning the conductive film to form the first and second electrodes.

4. A method for fabricating a semiconductor device according to claim 3, wherein the semiconductor device is a static RAM, and each electrode is a gate electrode of a transistor in a memory cell of the static RAM.

5. A method for fabricating a semiconductor device comprising the steps of:
    forming at least first and second electrodes having an insulating film thereon on a semiconductor substrate, a thickness of the insulating film on a contact region of the first electrode being smaller than that on the second electrode;
    forming an impurity diffusion region in the semiconductor substrate between the first and second electrodes;
    forming an insulation layer over the electrodes and the impurity diffusion region to form a multiple level insulator on at least portions of the electrodes;
    etching the insulation layer covering a portion of the impurity diffusion region until a surface of the impurity diffusion region is exposed;
    at substantially the same time the insulating layer is etched, etching a part of the multiple level insulator on the contact region of the first electrode until a surface of the first electrode is exposed; and
    forming an interconnecting conductive layer over the electrodes and impurity diffusion region to interconnect the exposed surfaces of the impurity diffusion region with the contact region of the first electrode.

6. A method for fabricating a semiconductor device according to claim 5, further comprising the steps of:
    after forming the impurity diffusion region, forming insulating side walls on the electrodes; and
    forming a higher impurity concentration area within the impurity diffusion region aligned with the insulating side walls.

* * * * *